United States Patent
Knee et al.

(10) Patent No.: US 7,194,651 B2
(45) Date of Patent: Mar. 20, 2007

(54) DISTRIBUTED LINK MODULE ARCHITECTURE

(75) Inventors: Derek L. Knee, Fort Collins, CO (US); Thomas N. Indermaur, Denver, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1098 days.

(21) Appl. No.: 10/109,480

(22) Filed: Mar. 28, 2002

(65) Prior Publication Data

US 2003/0194032 A1   Oct. 16, 2003

(51) Int. Cl.
*G06F 1/00* (2006.01)
*G06F 17/50* (2006.01)

(52) U.S. Cl. .......................................... 713/500; 716/7
(58) Field of Classification Search ................ 713/500; 716/7

See application file for complete search history.

(56) References Cited

U.S. PATENT DOCUMENTS

| | | | | |
|---|---|---|---|---|
| 4,849,751 A | * | 7/1989 | Barber et al. | 340/825.02 |
| 6,208,667 B1 | * | 3/2001 | Caldara et al. | 370/503 |
| 6,636,932 B1 | * | 10/2003 | Regev et al. | 710/317 |
| 2003/0037200 A1 | * | 2/2003 | Mitchler | 710/316 |

* cited by examiner

*Primary Examiner*—Thomas Lee
*Assistant Examiner*—Ji H. Bae

(57) ABSTRACT

A link module architecture is disclosed for use with a multi-core central processing unit having a cross bar switch. The link module comprises timing recovery circuitry operably coupled to the central processing unit, wherein the timing recovery circuitry is positioned proximate to the cross bar switch. The link module further comprises a bit receiver operably coupled to the central processing unit, and a bit output driver operably coupled to the central processing unit. The bit receiver, preferably comprising a wide bandwidth amplifier, and the bit driver are preferably integrated with a sea of on-chip RAM.

14 Claims, 4 Drawing Sheets

DISTRIBUTED LINK MODULE ARCHITECTURE

FIELD OF THE INVENTION

The present invention generally relates to multi-core central processing units and particularly relates to the link layout architecture for a central processing unit.

BACKGROUND OF THE INVENTION

New computer architectures, especially those utilizing multiprocessor technologies, use high-speed serial point-to-point link interconnect strategies. These links typically have high frequency (2 GHz plus) signaling that, due to losses in the transmission media (printed circuit board and connectors), results in small signals being received at the input of the destination chip. These small amplitude signals are normally sent differentially to increase the link reliability and reduce the link's sensitivity to common-mode noise. A link module typically consists of one to twenty bits of data operating in bidirectional mode. A link module also typically includes timing recovery circuitry (multi-phase lock loop) and voltage restore circuitry (integrating receivers). This architecture has many advantages.

Among these advantages, the architecture provides a simpler chip floor plan for large, multi-core, multi-link central processing units. These advantages further include centralized link timing recovery and simplified link to cross bar synchronization. Still further advantages of this architecture include fewer phase lock loops required for clock generation, and a shared cross bar switch, link, and core clock generation. The particulars of this architecture, however, are dictated at least in part by the high-speed link requirements.

The critical signaling requirements of these high-speed links require sensitive analog receiver and transmitter circuitry plus sensitive timing recovery blocks. The placement and grouping of these analog blocks are constrained by several issues, wherein the issues include:

- common analog power supplies;
- common external reference components;
- C4 bump density, package routing density, and pin density issues;
- clock and data skew;
- placement of the link receiver and transmitters relative to other on-chip input output modules like, for example, the cross bar switch;
- on-chip routes and route propagation delays; and
- placement within a sea of on-chip cache random access memory.

These issues are aggravated by characteristics of high performance link-based central processing units.

High performance multi-core central processing units possess characteristics that aggravate issues constraining placement and grouping of the analog blocks. For example, high performance multi-core central processing units with large amounts of on-chip cache random access memory result in large die sizes. These high performance central processing units also have many high-speed links, and an on-chip cross bar switch so as to enable the construction of larger multi-processor computer systems without the need for many external core electronic components. Large die size central processing units with six or more links aggravate the layout of the high-speed links.

FIG. 1 illustrates a typical layout scheme for a dual core central processing unit 10 with six high-speed link modules 12, a cross bar switch 14, and a large amount of on-chip cache random access memory 16. In accordance with the existing link layout architecture, each of the individual link modules 12 is placed on the edge of the die to satisfy C4 bump, package route, and co-existence within the cache random access memory constraints. Due to the large distances involved when the link modules are arranged in such long and narrow rectangular geometry, each link module contains its own phase lock loop (IO-PLL) 18. This IO-PLL 18 generates the local clock phases required to retime the incoming small analog signals, and must be placed in close proximity to the link receivers to minimize timing jitter and routing skew issues. The IO-PLL 18 clock phases are shared between all the individual bits of each link.

Due to the large number of links per central processing unit, links have to be placed on two or more sides of the die. Also, the cross bar switch 14 needs to be close to all of the link modules 12 to reduce timing and synchronization issues. Therefore, the cross bar switch 14 resides between the two central processing unit cores 22 in a central area delineated by placement of the central processing unit cores 22. The cross bar switch 14 also lies next to the system phase lock loop (SYS-PLL) 20. The SYS-PLL 20 generates timing for the two cores 22 and the cross bar switch 14.

This link 12 and core 22 layout architecture has a large number of separate phase lock loop circuits. Altogether there are seven phase lock loop circuits, and each of these phase lock loops are driven from an external global clock. This architecture has the issue of timing delay and synchronization across the die from the cross bar switch 14 to the link modules 12 at the edge of the die.

The link module 12 recovers and retimes the data at the link module 12 and close to the C4 bumps of the receivers. However, due to the long thin rectangular shape of each link module 12, extra timing skew is incurred when the individual bits are combined together to form a bus of the link received data.

An electrical block diagram 24 of a conventional link module is shown in FIG. 2. The link module contains both the receivers and output drivers. Each bit's output driver 26 consists of a source terminated differential driver with an output level pre-emphasis stage 28. The output pre-emphasis stage 28 uses a phase of the IO-PLL 30 to delay the output signal and determine the need or not for level emphasis or reduction.

Each bit in the link module will utilize either a strobed sampler or an integrating receiver amplifier 32. The timing recovery portion of the link module is also performed on a per bit basis. The IO-PLL 30 generates a four phase output clock at the incoming bit-rate. Each bit contains an interpolator block 34, which is trained during a power up period to estimate a best case strobe, and the strobe is used to latch the output of the integrating receiver amplifiers 32 with latch component 36. The deskew circuitry 38 aligns the individual bits at the outputs of the receivers to generate the final bus result.

The link layer control block 40 performs other link control and buffering functions which interface between the link electrical layer, the link protocol layers, and the cross bar switch 42.

Communication route 44 and communication route 46 in this methodology are long and accrue timing and skew issues. These routes exist between the cross bar switch 42 and the link layer control module 40 where data is being transferred synchronously with the system clock. Managing clock skew across route 44 and 46 is a difficult problem.

There remains, therefore, a need for a solution to the aforementioned problems. The present invention provides such a solution.

SUMMARY OF THE INVENTION

In a first aspect the present invention is a link module for use with a multi-core central processing unit having a cross bar switch. The link module comprises timing recovery circuitry operably coupled to the central processing unit, wherein the timing recovery circuitry is positioned proximate to the cross bar switch. The link module further comprises a bit receiver operably coupled to the central processing unit, and a bit output driver operably coupled to the central processing unit.

In another aspect, the present invention is a link based central processing unit comprising a die having a plurality of core central processing units located near the central area of the die and surrounded by a sea of cache random access memory. A cross bar switch, a system phase lock loop, and a link timing recovery circuit are all situated within the central area. A plurality of bit receiver and bit output driver pairs are located away from the central area within the sea of cache random access memory.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
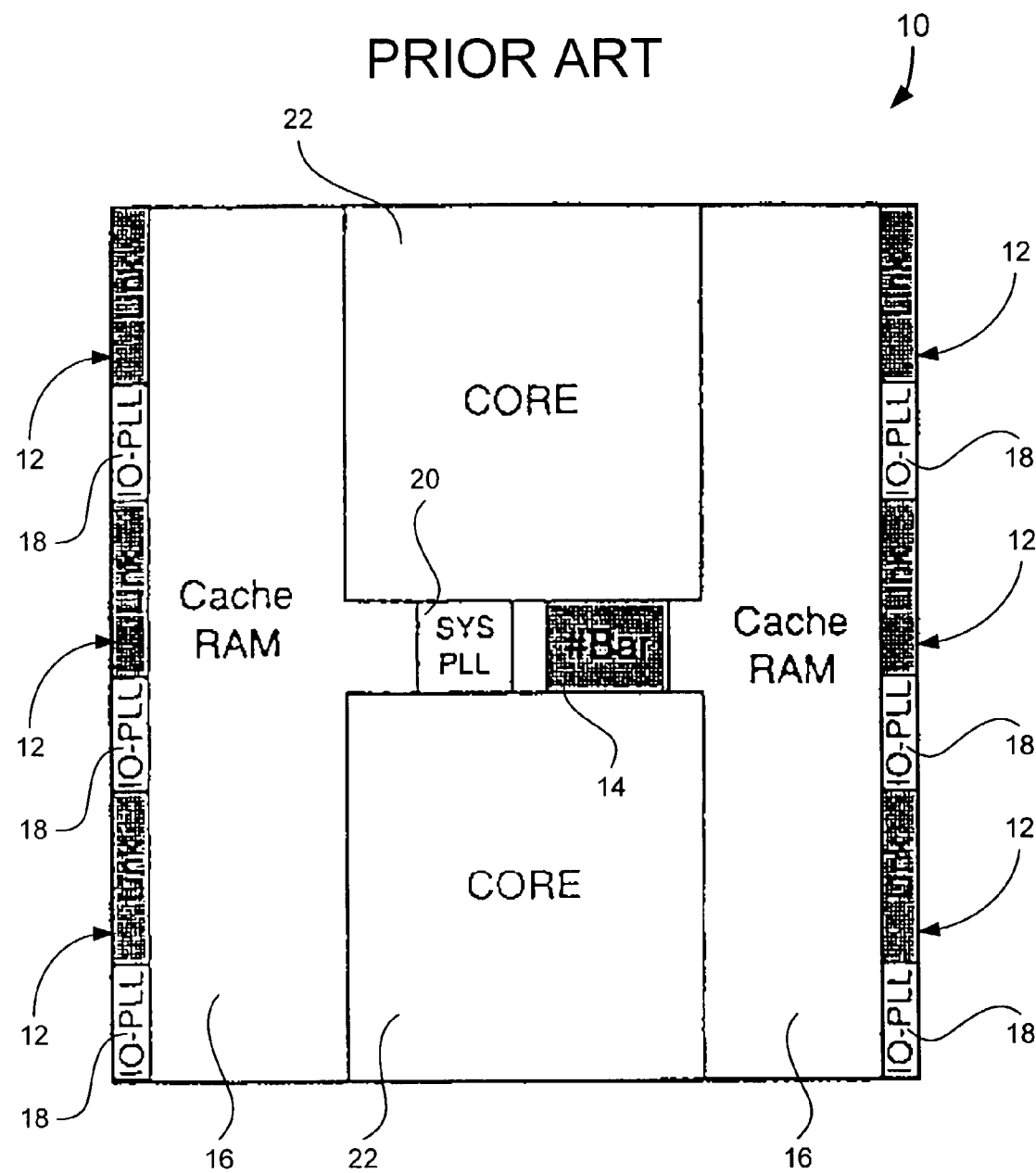
FIG. 1 is a block diagram of existing link layout architecture according to previous technology.
Figure 2:
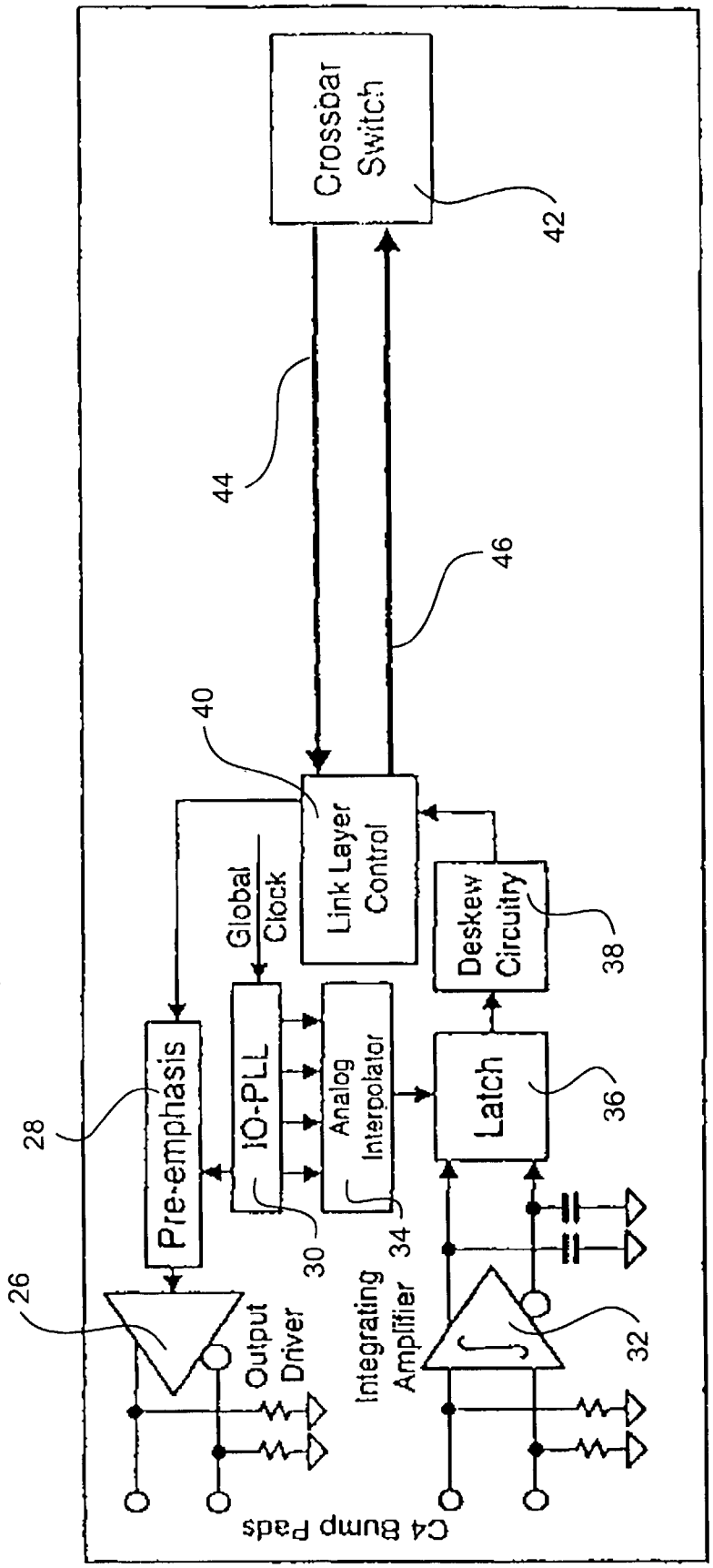
FIG. 2 is a block diagram of existing electrical architecture for a link module according to previous technology.
Figure 3:
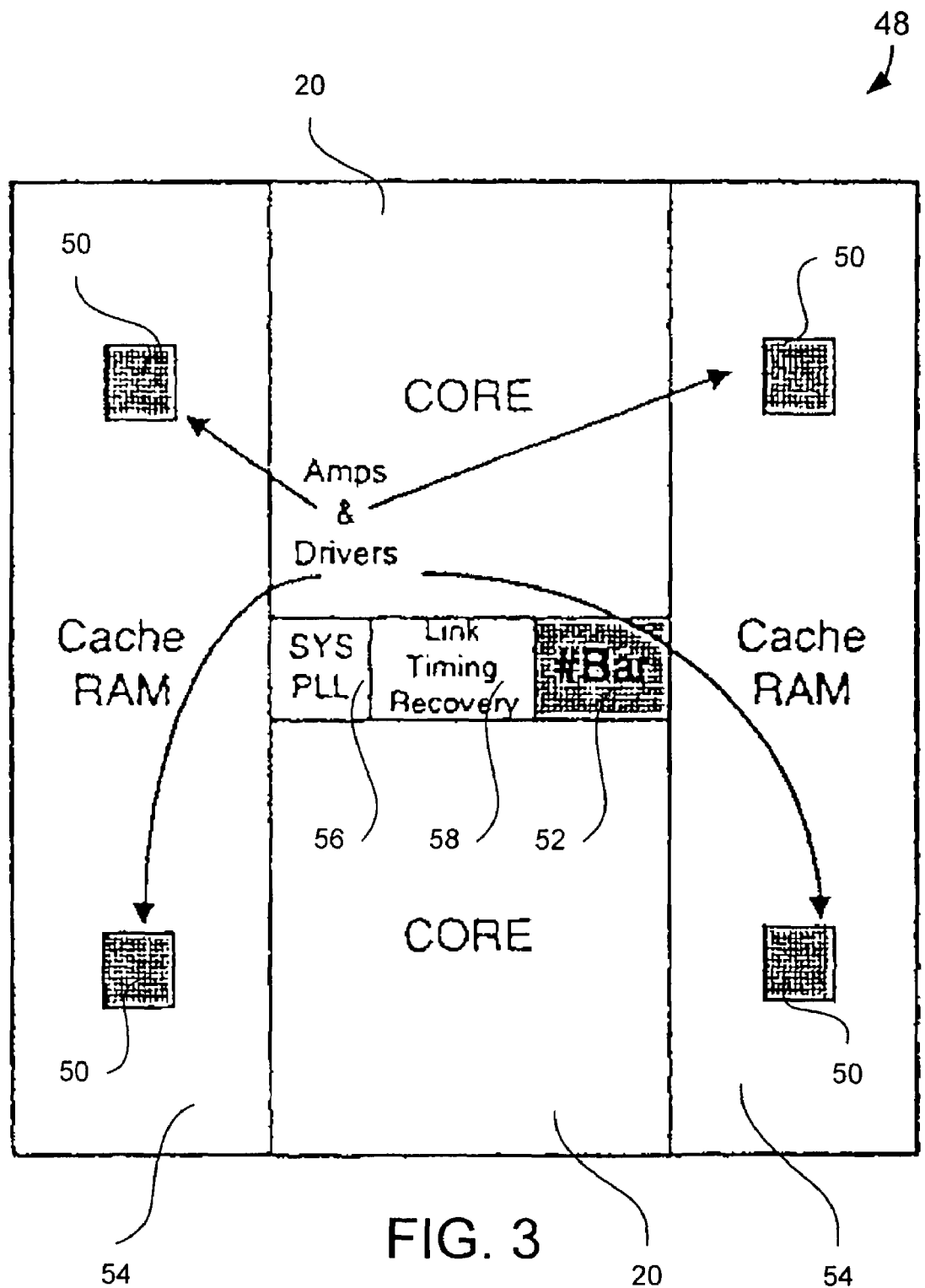
FIG. 3 is a block diagram of link layout architecture according to the present invention.

Referring to FIG. 3, a link layout architecture 48 according to the present invention is shown. In this scheme, only the bit receivers and bit output drivers 50 (with their pre-emphasis circuitry) are placed at a distance from the cross bar switch 52. The remaining link module circuitry for all the links is placed near to the cross bar switch 52. The remote link circuitry is much smaller than the existing methodology, which allows this circuitry to be more easily integrated into the sea of cache random access memory 54. As shown in FIG. 3, the bit receivers and bit output drivers 50 are grouped into 4 regions. There could, however, be more regions since there are no major constraints as to where these remote analog regions could be placed other than the C4 and package constraints. Therefore, these remote analog regions, being smaller and less constrained, can be optimized in placement for the C4 bumps and package.

A feature of this architecture 48 is that the remote communication between the cross bar/link logic in the center of the die and the remote analog circuitry is digital asynchronous. The remote digital asynchronous signals can be routed and buffered across the die without timing or skew penalty.

Timing recovery, deskew, and bus assembly are all performed in one area of the die. This centralization allows reduction of the phase lock loop count to one. In other words, the SYS-PLL 56 can be used to supply all of the clock phases for timing recovery because of its close proximity to the cross bar switch 52 and link module timing recovery circuitry 58. This simplifies the synchronization between the links and the cross bar switch 52."

With this configuration, the input receiver and output driver can be positioned to lie symmetrically and under C4 bump pairs, thus optimizing their performance and reducing their sensitivity to common-mode noise.

Figure 4:
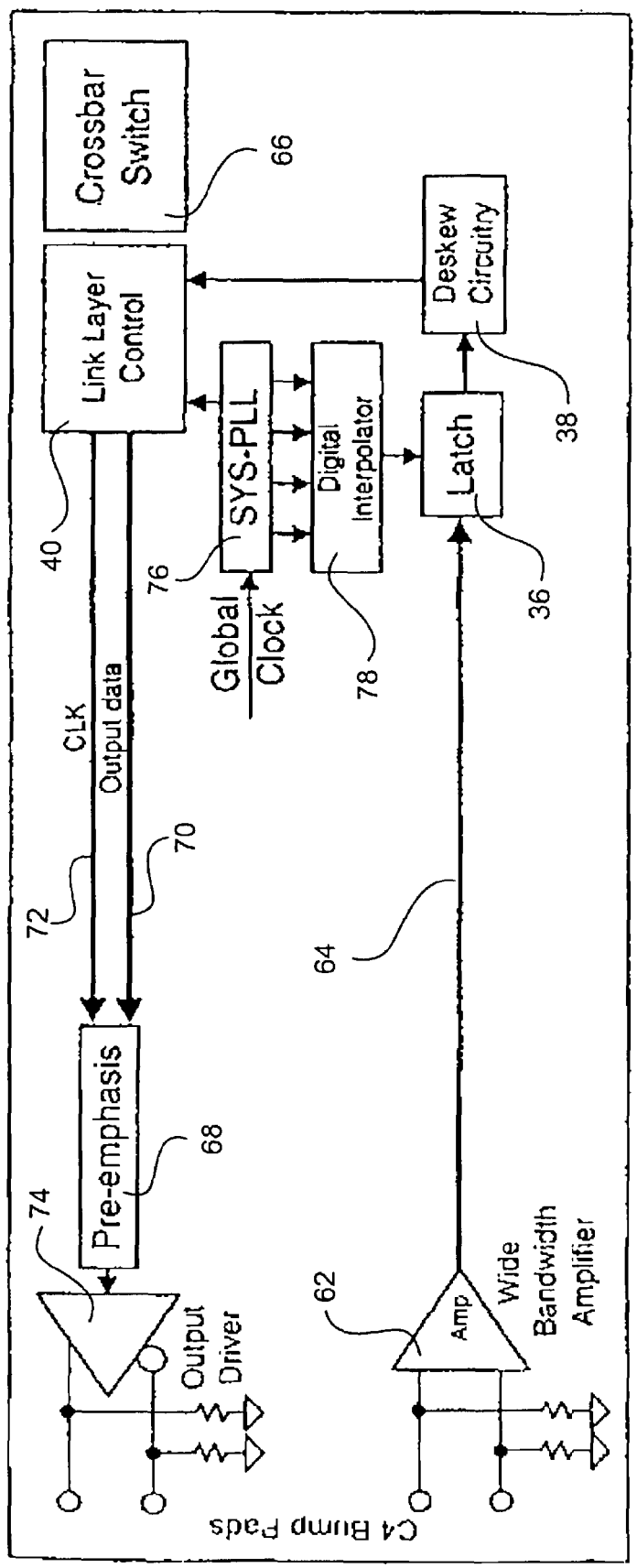
FIG. 4 is a block diagram of electrical architecture for a link module according to the present invention.

Referring to FIG. 4, the electrical architecture 60 of a link module according to the present invention is shown. In this electrical system the integrating amplifier is replaced with a wide bandwidth amplifier 62 to reconstruct the voltage information. Due to the finite gain-bandwidth product of this amplifier, its function is primarily the same as the integrating amplifier, but without the need to be reset. This scheme also leverages the increased gain-bandwidth of today's modern high-speed integrated circuit processes to allow the load terminated differential amplifier to regenerate the small incoming analog signal, and generate the rail-to-rail digital output signal. As stated above, this received signal now has its voltage levels restored, allowing it to be transmitted across the die via route 64 to the cross bar switch 66 and remaining link blocks for timing deskewing. Any additional noise or timing jitter accrued on the amplified signal as it crosses the die (due to active repeaters) will be removed by the timing recovery circuitry at the cross bar switch 66.

All the remote and asynchronous signals converge on the one area on the die. This area contains the SYS-PLL 76, remaining link module blocks, and cross bar switch 66. The incoming signals are re-timed using the multi-phase output SYS-PLL 76. Since the received signals are digital in nature, this new scheme lends itself to using a single digital interpolator 78 to determine the strobe points and the re-timer element can be a simple D-type flip-flop.

What is claimed is:

1. A link module for use with a multi-core central processing unit having a cross bar switch, the link module comprising:

timing recovery circuitry operably coupled to the central processing unit, wherein said timing recovery circuitry is positioned proximate to the cross bar switch;

a plurality of bit receiver and bit output driver pairs spatially separated from the timing recovery circuitry and disposed along a periphery of the central processing unit, wherein each of the bit receiver and bit output driver pairs is operably coupled to the central processing unit; and wherein the central processing unit has a sea of random access memory, and wherein at least one of said plurality of bit receivers and at least one of said plurality of bit output drivers are integrated with the sea of random access memory.

2. The link module of claim 1, wherein at least one of said plurality of bit receivers comprises a wide bandwidth amplifier.

3. The link module of claim 1, wherein at least one of said plurality of bit output drivers comprises a source terminated differential driver having output level pre-emphasis circuitry.

4. The link module of claim 1, wherein said timing recovery circuitry comprises a system phase lock loop, wherein said system phase lock loop provides a clock output to at least one of said plurality of bit output drivers.

5. The link module of claim 4, wherein said timing recovery circuitry comprises a digital interpolator.

6. The link module of claim 5, wherein said timing recovery circuitry comprises:
   a link layer control block;
   deskew circuitry; and
   a latch.

7. The link module of claim 6, wherein said latch corresponds to a single D-type flip flop.

8. The link module of claim 1, wherein at least one of said plurality of bit receivers and at least one of said plurality of bit output drivers lie symmetrically under C4 bump pairs.

9. A link based central processing unit comprising:
   a die;
   a plurality of core central processing units operably coupled to said die in a distributed fashion, wherein said plurality of core central processing units are arranged so as to substantially delineate a central area of said die;
   a sea of cache random access memory operably coupled to said die, wherein said sea of cache random access memory is situated substantially outside the central area;
   a cross bar switch operably coupled to said die, wherein said cross bar switch is situated substantially within the central area;
   a system phase lock loop operably coupled to said die, wherein said system phase lock loop is situated substantially within the central area;
   link timing recovery circuitry operably coupled to said die, wherein said link timing recovery circuitry is situated substantially within the central area adjacent to said cross bar switch; and
   a plurality of bit receiver and bit output driver pairs operably coupled to said die, wherein said plurality of bit receiver and bit output driver pairs are substantially integrated with said sea of cache random access memory.

10. The link based central processing unit of claim 9 wherein at least one of said plurality of bit receivers is further defined as a wide bandwidth amplifier and at least one of said plurality of bit output drivers is further defined as a source terminated differential driver.

11. The link based central processing unit of claim 9 wherein the plurality of bit receiver and bit output driver pairs lie symmetrically under C4 bump pairs.

12. A link layer architecture for multi-core central processing units, comprising;
   two or more central processing units;
   a cross bar switch situated between the two or more central processing units;
   a link timing recovery circuit operably coupled to the cross bar switch and situated adjacent to the cross bar switch;
   a plurality of bit receiver and bit output driver pairs spatially separated from the link timing recovery circuit and disposed outside a periphery formed by the central processing units, wherein each of the bit receiver and bit output driver pairs is operably coupled to the link timing recovery circuit; and a sea of cache random access memory disposed outside the periphery formed by the central processing units, wherein the plurality of bit receiver and bit output driver pairs are substantially integrated with the sea of cache random access memory.

13. The link layer architecture of claim 12 further comprises a system phase lock loop situated between the two or more central processing units.

14. The link layer architecture of claim 13 wherein the plurality of bit receiver and bit output driver pairs lie symmetrically under C4 bump pairs.

* * * * *